United States Patent
Suzuki et al.

(10) Patent No.: US 8,008,757 B2
(45) Date of Patent: Aug. 30, 2011

(54) RESINOUS HOLLOW PACKAGE AND PRODUCING METHOD THEREOF

(75) Inventors: Daisuke Suzuki, Chiba (JP); Masayuki Kondo, Ichihara (JP)

(73) Assignee: Mitsui Chemicals, Inc., Minato-Ku, Tokyo (JP)

(*) Notice: Subject to any disclaimer, the term of this patent is extended or adjusted under 35 U.S.C. 154(b) by 228 days.

(21) Appl. No.: 12/162,504

(22) PCT Filed: Jan. 30, 2007

(86) PCT No.: PCT/JP2007/051450
§ 371 (c)(1),
(2), (4) Date: Jul. 29, 2008

(87) PCT Pub. No.: WO2007/088835
PCT Pub. Date: Aug. 9, 2007

(65) Prior Publication Data
US 2009/0061554 A1    Mar. 5, 2009

(30) Foreign Application Priority Data
Feb. 3, 2006   (JP) ................................. 2006-027326

(51) Int. Cl.
*H01L 23/495* (2006.01)
*H01L 31/0203* (2006.01)
*H01L 23/48* (2006.01)
*H01L 23/52* (2006.01)

(52) U.S. Cl. ........ 257/676; 257/433; 257/690; 257/692; 257/E23.002

(58) Field of Classification Search .................. 257/690, 257/433, 676, 692, E23.002
See application file for complete search history.

(56) References Cited

U.S. PATENT DOCUMENTS
5,164,815 A * 11/1992 Lim ............................. 257/666
(Continued)

FOREIGN PATENT DOCUMENTS
JP             63031147 A    *    2/1988
(Continued)

OTHER PUBLICATIONS
PTO/ISA/210.
(Continued)

*Primary Examiner* — Minh-Loan T Tran
*Assistant Examiner* — Teresa M Arroyo
(74) *Attorney, Agent, or Firm* — Buchanan Ingersoll & Rooney PC (57) ABSTRACT

The present invention provides a resinous hollow package that includes a moisture-proof island that is a planar structure disposed below a semiconductor element mounting surface of the resinous hollow package, the semiconductor element mounting surface having an area of 200 mm$^2$ or more and the maximum wave height of a wave curve of 35 µm or less. The resinous hollow package of the invention has an excellent moisture resistance due to the moisture-proof island included therein. Further, since the flatness of the semiconductor element mounting surface is excellent, decrease in the amount of light in a peripheral portion of an image can be suppressed in a digital single-lens reflex camera or the like with a large solid-state image sensor, even when a wide angle lens is used. According to the method of producing the resinous hollow package of the invention, by carrying out insert-molding while fixing the moisture-proof island with projection(s) disposed to the mold to prevent displacement thereof, the resinous hollow package having the maximum wave height of the semiconductor element mounting surface of 35 µm or less can be provided.

10 Claims, 3 Drawing Sheets

U.S. PATENT DOCUMENTS

| | | | | | |
|---|---|---|---|---|---|
| 5,397,915 | A | * | 3/1995 | Nose | 257/676 |
| 5,424,576 | A | * | 6/1995 | Djennas et al. | 257/666 |
| 5,474,958 | A | * | 12/1995 | Djennas et al. | 29/827 |
| 5,917,234 | A | * | 6/1999 | Tsuruzono | 257/667 |
| 6,028,350 | A | * | 2/2000 | Sabyeying | 257/670 |
| 2007/0262426 | A1 | * | 11/2007 | Mahler | 257/669 |

FOREIGN PATENT DOCUMENTS

| | | |
|---|---|---|
| JP | 06-029504 | 2/1994 |
| JP | 2539111 B | 10/1996 |
| JP | 2004-147007 A | 5/2004 |
| JP | 2004-221143 A | 8/2004 |
| JP | 2005-217329 A | 8/2005 |

OTHER PUBLICATIONS

PTO/ISA/237.

Notifications of Reasons for Refusal issued in corresponding Japanese Patent Application No. 2007-556869 dated Mar. 1, 2011 with English Translation.

* cited by examiner

RESINOUS HOLLOW PACKAGE AND PRODUCING METHOD THEREOF

TECHNICAL FIELD

The present invention relates to a resinous hollow package for mounting a semiconductor element such as a solid-state image sensor or the like; in particular, a resinous hollow package for mounting a large-scale solid-state image sensor that is used in a digital single-lens reflex camera and so on, and a method thereof. Furthermore, the invention relates to a semiconductor device that uses a resinous hollow package for mounting a large-scale solid-state image sensor, and an electronic instrument including the semiconductor device.

BACKGROUND ART

The properties of a semiconductor element are deteriorated due to variations in environmental humidity or temperature, and due to contact with fine dust or foreign matter. Also, semiconductor elements are readily damaged due to vibration or impact. In order to protect semiconductor elements from these external factors, a ceramic box or a resin for sealing is normally used as a semiconductor package.

In the case of a solid-state image sensor such as a CCD or a C-MOS, or a semiconductor element having an optical function such as a photo-diode and a photo-sensor, a transmission path for light is required between a semiconductor element mounted inside a package and the exterior of the package. Accordingly, in the case of a semiconductor element having an optical function, the periphery of the package cannot be entirely covered with a resin or ceramic. For this reason, semiconductor elements having an optical function are generally mounted at a hollow-type package having an opening, and the opening is sealed with an optically transparent window material such as glass for use as a semiconductor package.

In recent years, a large market for digital cameras has emerged. Together with increasing reductions in size and weight, and simplification in the operation of digital compact cameras, has come increased demands for improving image quality by enhancing expression of gradation rather than by increasing the number of pixels, and for employing special photographic techniques. Consequently, in recent years, the fields of development and commercialization of digital single-lens reflex cameras have become particularly active.

In digital single-lens reflex cameras, in order to realize high image quality, employ high-level camera techniques, and secure compatibility with lenses used in conventional single-lens reflex cameras that use silver salt films, a solid-state image sensor far larger than those used in digital compact cameras is used.

Table 1 is a list of representative CCD type solid-state image sensors that are used in digital compact cameras and digital single-lens reflex cameras. The size of the solid-state image sensors differ slightly depending on the manufacturer even when the same name is used; representative ones of each type are shown Table 1.

The name of the type of the image sensor mentioned in Table 1 are ones generally used for image sensors used in digital cameras. The size and area are actual measurement values of an imaging surface of the corresponding image sensor, the area ratio is a relative value of the area of the corresponding image sensor with respect to the area of a 35 mm size image sensor, which is regarded as 100, and the aspect ratio is a numerical value obtained by dividing the length of a long side of the corresponding image sensor by the length of a short side thereof.

The values mentioned here for the 35 mm size relate to values for conventional cameras that use silver salt films. However, these values are also adopted in a few high-end digital single-lens reflex cameras.

TABLE 1

| Camera Type | Image Sensor Type | Size/ mm × mm | Area/ mm² | Area Ratio | Aspect Ratio |
|---|---|---|---|---|---|
| Compact Type Camera | ¼ Inch | 3.6 × 2.0 | 7.2 | 0.8 | 1.80 |
|  | ⅓ Inch | 4.8 × 3.6 | 17.3 | 2.0 | 1.33 |
|  | ½ Inch | 6.4 × 4.8 | 30.7 | 3.6 | 1.33 |
|  | 1/1.8 Inch | 6.9 × 5.2 | 35.9 | 4.2 | 1.33 |
|  | ⅔ Inch | 8.8 × 6.6 | 58.1 | 6.7 | 1.33 |
| Single Lens Reflex-Type Camera | 4/3 Inch | 17.3 × 13.0 | 224.9 | 26.0 | 1.33 |
|  | APS-C | 23.7 × 15.6 | 369.7 | 42.8 | 1.52 |
|  | 35 mm Size | 36 × 24 | 864 | 100 | 1.5 |

Even the smallest class of a solid-state image sensor used in a single-lens reflex camera, known as four-thirds (4/3 inch size), is about four times as large as the biggest class of an image sensor used in a digital compact camera (⅔ inch size).

In conventional silver salt film cameras, even when light beams entering through an imaging lens are incident obliquely on a silver salt film on which an image is to be recorded, photoreceptors present in a photosensitive layer of the silver salt film react to record an image without showing any difference from the case when light beams are incident vertically on the silver salt film. Accordingly, in silver salt film cameras, there is no significant difference in photosensitivity between the center of the film where the incident angle of light beams is vertical and a periphery portion of the film where the incident angle of light beams is oblique.

On the other hand, in digital cameras, a solid-state image sensor corresponding to a silver salt film that records an image is formed from arrays of many pixels. Each pixel has a micro-condenser lens disposed on an imaging lens side that condenses light onto a power-generating layer such as a CCD or C-MOS located at a recess of the pixel to generate charges, thereby recording an image. A micro condenser lens disposed to each pixel in a solid-state image sensor is designed so as to condense light beams in parallel with an optical axis of the condenser lens onto a power-generating surface. Therefore, light beams at an incident angle of equal to or more than the critical angle to a micro condenser lens of each pixel are condensed onto a side surface of the pixel, rather than onto the power-generating layer at the recess of each pixel, thereby failing to record an image.

This problem is known as oblique incidence characteristic of an imaging sensor, and it is more serious with an imaging lens having a large image angle or a pixel located at a periphery position of an image sensor, since the reduced amount of light in a peripheral portion of an image degrades the image quality thereof.

Here, an incident angle means an angle formed by a normal line to a surface to which light is incident and the incident light. When light is incident vertically to the surface, the incident angle is 0°. The more obliquely the light is incident, the larger the value of the incident angle is.

In the case where an imaging lens is not exchanged, as with the case of a digital compact camera, it is possible to design a camera by considering the characteristics of an imaging lens and a solid-state imaging sensor as a whole so as to restrict an imaging angle of an imaging lens to a range in which the reduction in the amount of peripheral light is acceptable.

Furthermore, when the size of the solid-state image sensor used is small, since an image circle of the imaging lens is small and the incident angle at the pixels positioned at the periphery of the solid-state image sensor is not increased, the amount of light in a peripheral portion of an image does not decrease.

On the other hand, in a digital single-lens reflex camera, an imaging lens is exchanged by a user to one with a desired image angle. Therefore, it is necessary to design the camera so that decrease in the amount of light in a peripheral portion of an image may be within an allowable range, even when an ultra-wide angle lens with the largest image angle or a fisheye lens is used. Furthermore, the larger the size of the solid-state image sensor is, the larger the incident angle of light beam to pixels in the peripheral portion is, and the light amount tends to decrease.

Accordingly, in a digital single-lens reflex camera that uses a large solid-state image sensor, as compared with a digital compact camera, desired dimensional accuracy of a resinous hollow package that mounts a solid-state image sensor is significantly stringent. In particular, when the flatness of a mounting surface for a semiconductor element is poor and the solid-state image sensor is obliquely mounted to the resinous hollow package, reduction in the amount of light in the peripheral portion may occur in an uneven manner. Namely, in pixels in the peripheral portion of the image sensor on an uplifted side from the mounting surface for the semiconductor element, the incident angle of incident light is decreased and reduction in the amount of light is less likely to occur. On the other hand, in pixels in the peripheral portion of the imaging sensor on a subsiding side, the incident angle of incident light is further increased and the amount of light is reduced to a degree that exceeds a designed value.

There is a demand for digital single-lens reflex cameras to ensure operation even under conditions that are so severe that a digital compact camera cannot work properly, such as those of news photography or mountain photography. In order to secure operation of a solid-state image sensor, moisture resistance is particularly important among various factors. In order to address the above problem, Japanese Patent No. 2539111, for instance, discloses a technology of providing a moisture-proof island that inhibits moisture penetration under a semiconductor element mounting surface of a resinous hollow package on which a solid-state image sensor is mounted.

Patent literature 1: Japanese Patent No. 2539111

DISCLOSURE OF THE INVENTION

A resinous hollow package of the present invention, provided with a moisture-proof island, has an excellent anti-moisture property, since moisture is inhibited from permeating from a bottom surface of a package. This effect is more remarkable when the area of the moisture-proof island is large, for instance, when the area of the moisture-proof island in a package for a digital single-lens reflex camera is not less than 100 $mm^2$.

Furthermore, the flatness of the semiconductor element mounting surface of the package can be improved by providing the aforementioned moisture-proof island. Namely, the resinous hollow package of the invention is produced by inserting a lead frame into a mold, injecting a molding resin into the mold under heat and pressure, and taking out the resin that has cured from the mold. The volume of the molding resin is contracted in the process of curing the resin, and the amount of contraction is proportional to the amount of molding resin. Accordingly, the amount of contraction is largest at a sidewall portion of the package where a layer of the molded resin is thickest.

Figure 5A:
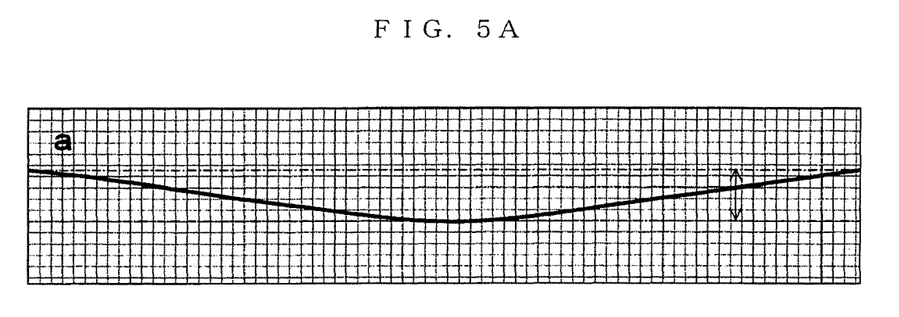
FIG. 5A is a diagram illustrating a wave curve of a semiconductor element mounting surface of a resinous hollow package.
Figure 5B:
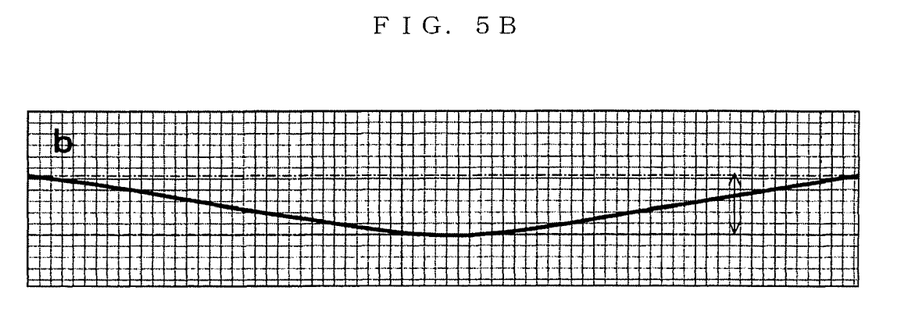
FIG. 5B is a diagram illustrating a wave curve of a semiconductor element mounting surface of a resinous hollow package.
Figure 5C:
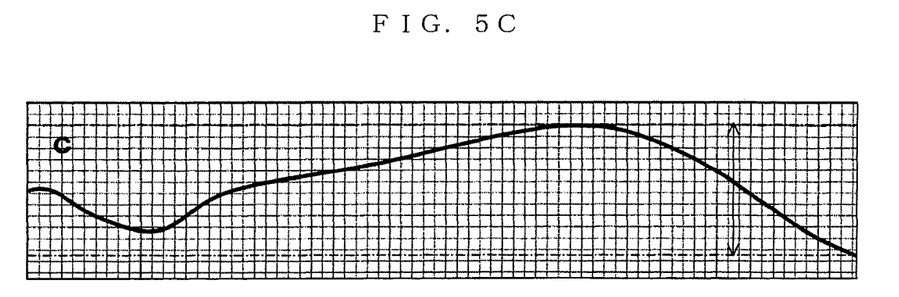
FIG. 5C is a diagram illustrating a wave curve of a semiconductor element mounting surface of a resinous hollow package.
Figure 5D:
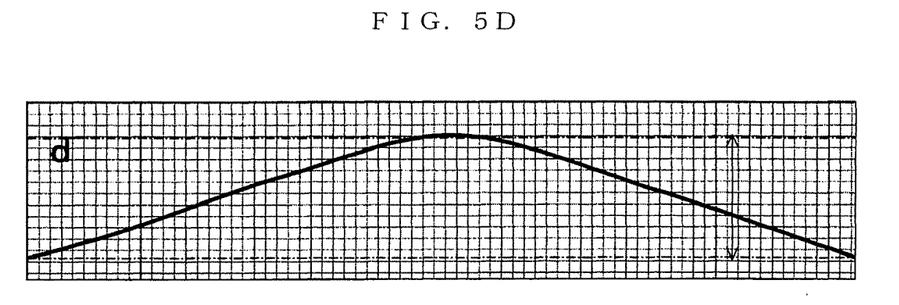
FIG. 5D is a diagram illustrating a wave curve of a semiconductor element mounting surface of a resinous hollow package.

In a resinous hollow package that is not provided with a moisture-proof island, a peripheral portion of a semiconductor element mounting surface is pulled by a sidewall portion due to contraction of the sidewall portion. Therefore, the amount of contraction is increased as compared with that of a center portion. As a result, the semiconductor element mounting surface tends to have a convex shape with the uplifted center part. An example of a wave curve as measured by a surface roughness meter of a semiconductor element mounting surface of a resinous hollow package with no moisture-proof island is shown in FIG. 5D. In FIGS. 5A through 5D, a horizontal axis is 25 mm at full scale and a vertical axis is 50 μm at full scale. A height shown with an arrow in the drawing is the maximum wave height of the wave curve.

On the other hand, in a digital single-lens reflex camera or the like that employs a large image sensor, a resinous hollow package with a semiconductor element mounting surface having an area of not less than 200 $mm^2$, as shown in Table 1, is used. In the case of a resinous hollow package provided with a moisture-proof island, a lead frame that connects a moisture-proof island is inserted into a mold and fixed, followed by injecting a molding resin into a gap of the mold. The larger the resinous hollow package itself and the moisture-proof island, respectively, the moisture-proof island becomes more likely to be pushed away from a design position in the mold by a flow of the injected molding resin.

When the moisture-proof island is displaced from a design position, the moisture-proof island may tilt in the resinous hollow package or an end portion of the moisture-proof island that should be buried in may be exposed on a surface of the resinous hollow package.

In the resinous hollow package in which the moisture-proof island is displaced from the design position, the thickness of the molding resin layer between the semiconductor element mounting surface and the moisture-proof island varies by location. The amount of contraction of the molding resin also varies by location, resulting in deterioration of flatness of the semiconductor element mounting surface. An example thereof is shown in FIG. 5C.

The invention aims to provide an electronic equipment such as a digital single-lens reflex camera that exhibits excellent moisture resistance and has less decrease in the amount of light at a peripheral portion of an image.

The invention aims to provide a semiconductor device for use in an electronic equipment such as a digital single-lens reflex camera that exhibits excellent moisture resistance and has less decrease in the amount of light at a peripheral portion of an image.

The invention aims to provide a resinous hollow package for use in a digital single-lens reflex camera or the like, which package does not damage the moisture resistance and has less decrease in the amount of light at a peripheral portion of an image. Namely, the invention provides a resinous hollow package provided with a moisture-proof island, and whose semiconductor element mounting surface has excellent flatness.

In order to address the above-mentioned aims, the invention provides a resinous hollow package for mounting a semiconductor element, which is formed by insert-molding by inserting a lead frame including a moisture-proof island in connection therewith into a mold, wherein the area of a semiconductor element mounting surface of the resinous hollow package is not less than 200 $mm^2$ and the maximum wave height of a wave curve of a semiconductor element mounting surface as measured by a surface roughness meter is not more than 35 µm.

In the invention, a moisture-proof island is a planar structure disposed under a semiconductor element mounting surface of a resinous hollow package.

The insert-molding is a method including injecting, after inserting an object into a mold, a molding resin into the mold, thereby forming a resin molded article that is integrated with the inserted object.

The maximum wave height of a wave curve is the maximum height when a contour curve is a wave curve, as defined by JIS B0601: 2001 (corresponding international standard: ISO 4287: 1997).

The area of the semiconductor element mounting surface of the resinous hollow package is an area of a hollow portion at which a semiconductor element to be mounted is fixed, from which a terrace portion on which a later-described inner lead is exposed is excluded. When two or more of semiconductor elements are mounted on a single resinous hollow package, the area of the semiconductor element mounting surface of the resinous hollow package is also defined as an area of a hollow portion excluding a terrace portion.

In the resinous hollow package of the invention, the area of the moisture-proof island is preferably not less than 100 mm$^2$.

The resinous hollow package provided by the invention may be produced by injecting a molding resin into a mold in which a moisture-proof island is fixed by one or more projection provided in the mold.

A resinous hollow package including a semiconductor element mounting surface with the maximum wave height of an wave curve of not more than 20 µm can be produced by providing four projections for fixing the moisture-proof island on an upper mold and a lower mold that constitute the mold, respectively, or by providing four projections either one of the upper mold and the lower mold which is not provided with a gate for injecting the molding resin.

A resinous hollow package including a semiconductor element mounting surface with the maximum wave height of a wave curve of not more than 35 µm can be produced by providing one projection on either one of the upper mold and the lower mold which is not provided with a gate for injecting the molding resin.

Furthermore, an ejector pin that works to release a molded article from a mold may be designed to contact the moisture-proof island so that the ejector serves as the one or more projection for fixing the moisture-proof island.

EFFECT OF THE INVENTION

By employing a resinous hollow package of the invention, a digital single-lens reflex camera, in which deterioration of image quality in a peripheral portion of an image is reduced even when a wide-angle lens is used, without damaging the moisture resistance, can be produced.

BEST MODE FOR CARRYING OUT THE INVENTION

In the following, a method of producing a resinous hollow package of the present invention will be described.

First, a lead frame that is used in a resinous hollow package will be described.

Figure 1:
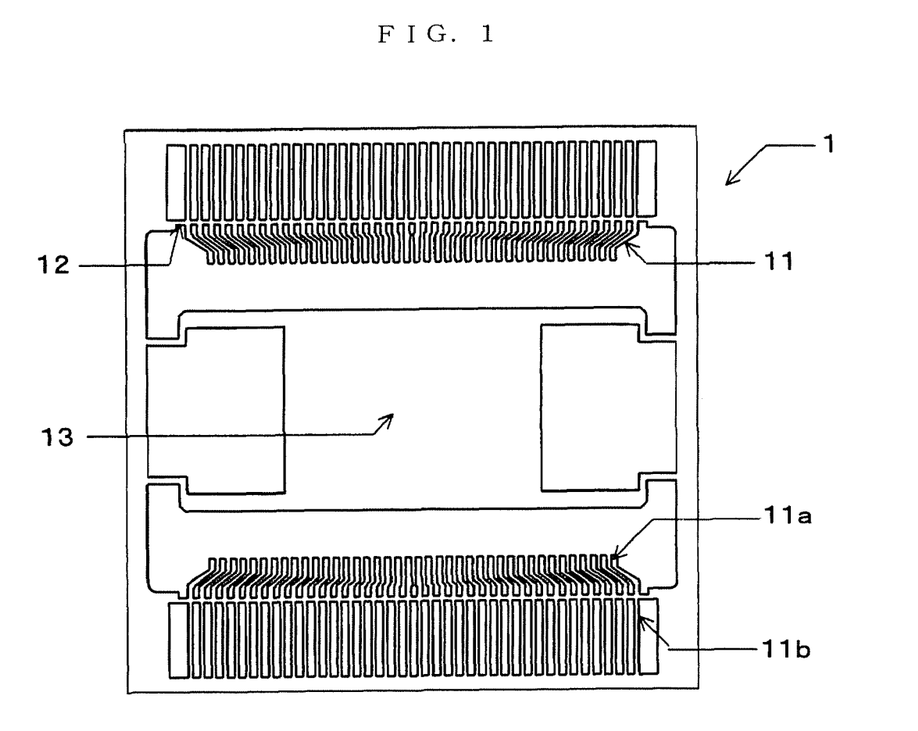
FIG. 1 is a plan view illustrating a lead frame including a moisture-proof island in connection with the lead frame.

FIG. 1 shows a plan view of a lead frame including a moisture-proof island connected to the lead frame that can be used in the invention. A lead frame 1 including a moisture-proof island connected to the lead frame illustrated in FIG. 1 is provided with 40 lead pins 11 for each of an upper side and a lower side of FIG. 1. A portion of the lead pin 11, which is to be exposed on a terrace portion of a hollow portion of a resinous hollow package and to be electrically connected to a semiconductor element to be mounted, is called an inner lead 11a. A portion of the lead pin 11, which is to be extended outside of the resinous hollow package and to be electrically connected to an external mounting substrate, is called an outer lead 11b. Adjacent lead pins are connected to each other by a dam bar 12 so as to fix relative positions thereof.

At the center of the lead frame 1, a moisture-proof island 13 is disposed so as to be connected with the lead frame 1.

The amount of the lead pins disposed to the lead frame is designed depending on the amount of terminals of a semiconductor element to be mounted, and is usually between about ten several pieces to one hundred pieces.

The area of the moisture-proof island should be designed appropriately corresponding to a semiconductor element to be mounted and a degree of necessary moisture resistance, and is usually in the range of from about 80% to about 120% of a bottom surface of a semiconductor element to be mounted. Here, an area of a moisture-proof island is an area excluding a connection portion for connecting the moisture-proof island to the lead frame surrounding the moisture-proof island.

As a material of the lead frame, aluminum, copper, alumimim alloys, copper alloys and so on may be used, and an alloy called a 42 alloy is particularly preferably used.

The thickness of the lead frame is in the range of about 0.15 mm to about 0.3 mm. When a solid-state image sensor is mounted in particular, one having a thickness in the range of from 0.2 mm to 0.25 mm is preferably used.

In the invention, as an exemplary embodiment, an example is shown in which a connection portion of a lead frame including a moisture-proof island connected to the lead frame is bent in advance so that a plane formed by the moisture-proof island may be located below a plane formed by lead pins. If a semiconductor element to be mounted is desired to be electrically grounded to the moisture-proof island, the bending amount may be controlled or the bending process may be omitted, so that the moisture-proof island and the element mounting surface of the package are on the same plane.

Figure 2:
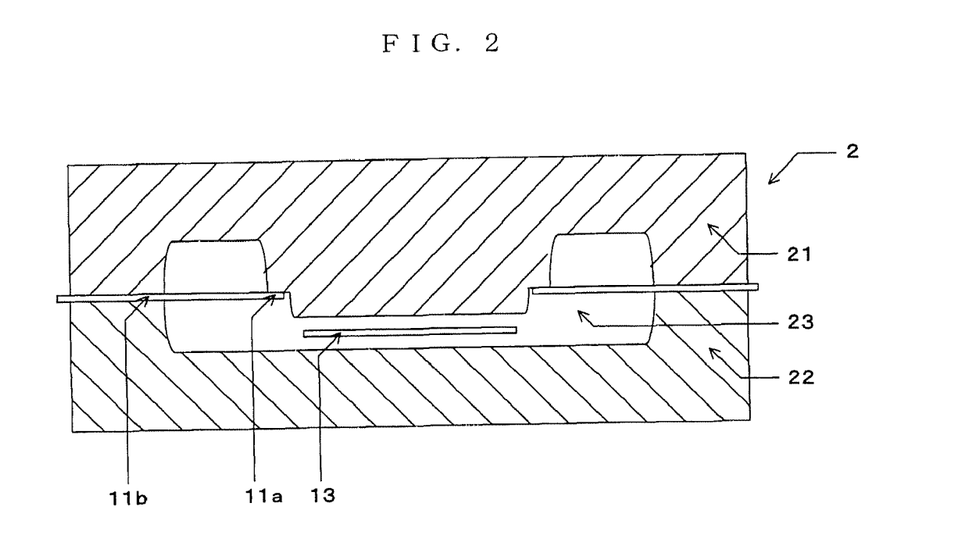
FIG. 2 is a sectional view illustrating a mold sandwiching and fixing a lead frame.

Next, a mold will be described. FIG. 2 shows a sectional view illustrating one exemplary embodiment of a mold for molding a resinous hollow package.

In FIG. 2, a lead frame 1 that is bent so that a plane formed by the moisture-proof island 13 may be located below a plane formed by the lead pins 11 is used. FIG. 2 is a sectional view of a plane including lead pins 11 near the center of a mold 2 in a state that the lead frame 1 is sandwiched between upper and lower molds 2.

The mold 2 is made of an upper mold 21 and a lower mold 22. A lead frame 1 including a moisture-proof island connected to the lead frame 1 is designed so that an outer lead portion 11b, including a dam bar 12, may be sandwiched and fixed by the upper mold 21 and the lower mold 22, and a tip of the inner lead 11a may contact a terrace portion of a hollow portion disposed to the upper mold.

The moisture-proof island 13 is suspended in a gap portion 23 of the mold 2 by a portion connected to the lead frame that has been bent, which is not shown in FIG. 2.

In a molding process, a molding resin is injected from a gate from which the molding resin is injected, which is not shown in FIG. 2. At a so-called weld line, which is generated at a portion where molding resins injected from different gates contact with each other, it is known that the bonding strength is significantly lowered. Accordingly, when molding a resinous hollow package, only one gate is generally provided so as to avoid formation of weld lines.

In the case of the mold 2 illustrated in FIG. 2, a gate for injecting a molding resin is usually provided to the lower mold 22. Therefore, the moisture-proof island 13 is more prone to be displaced by a flow of the injected molding resin at a side closer to the gate.

Figure 3:
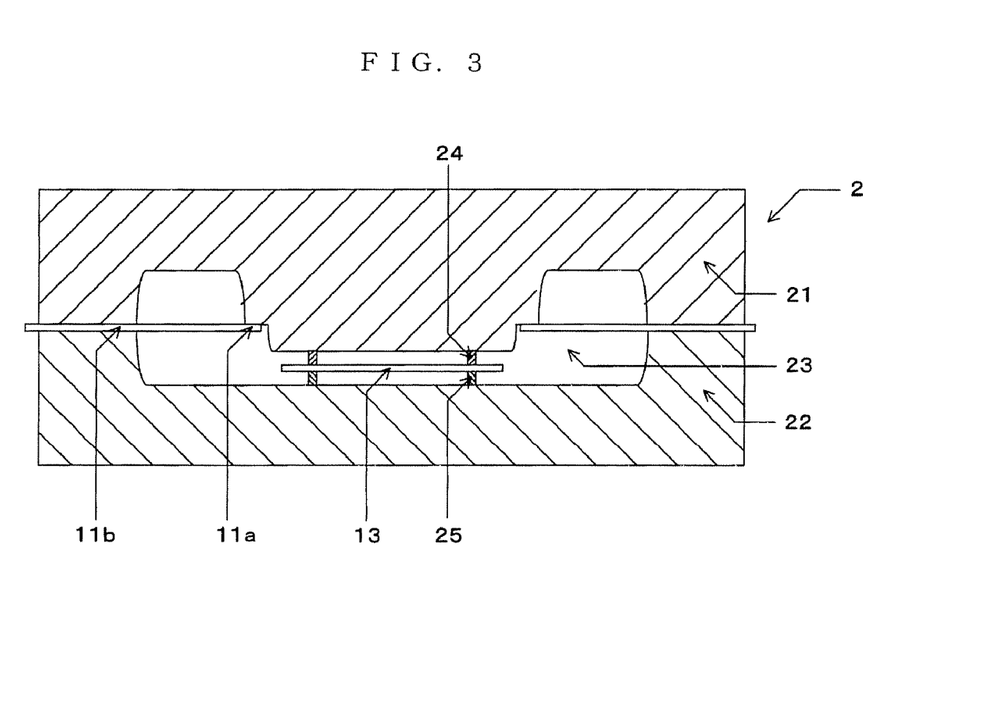
FIG. 3 is a sectional view illustrating a mold at a plane including projections that are provided to each of an upper mold and a lower mold, the projections sandwiching and fixing a lead frame.
Figure 4:
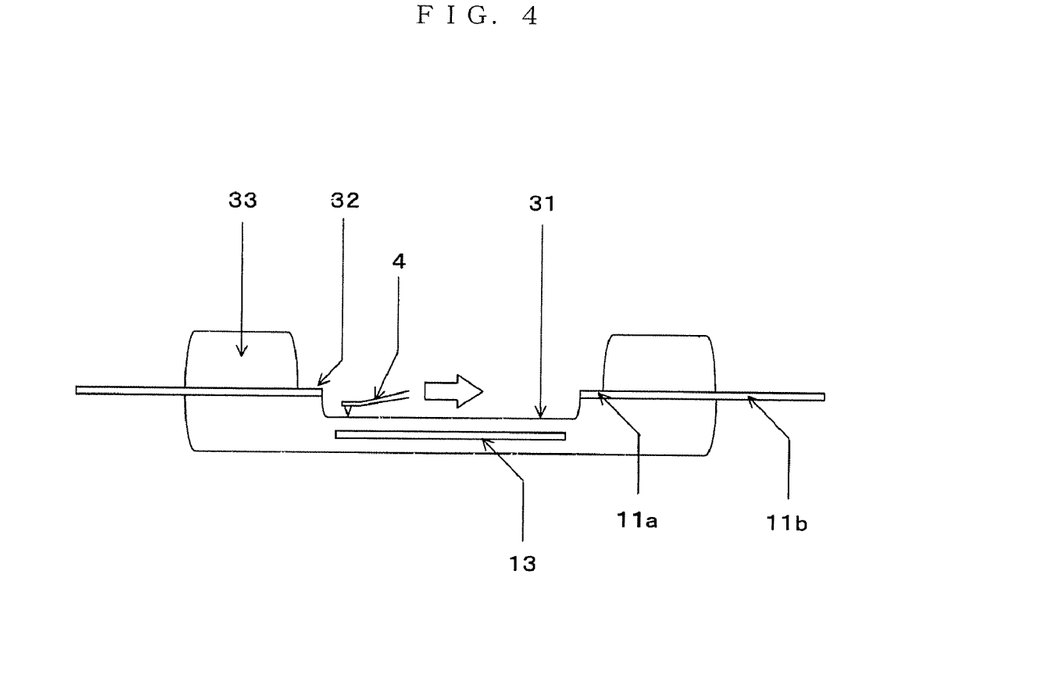
FIG. 4 is a schematic sectional view illustrating a situation of measuring a semiconductor element mounting surface of a resinous hollow package by means of a surface roughness meter.

FIG. 3 is a sectional view of a mold 2 with projections for fixing a moisture-proof island provided to both of an upper mold 21 and a lower mold 22 that is divided by a plane including the projections. In FIG. 3, projections disposed to the upper mold 21 are denoted by 24 and projections disposed to the lower mold are denoted by 25.

The mold 2 illustrated in FIGS. 2 and 3 is actually in many cases used in a reversed manner. However, here, the up and down sides of the mold are shown corresponding to the shape of the resinous hollow package.

A molding method of a resinous hollow package will be described.

To a gap portion 23 of the mold 2 that sandwiches the lead frame 1, a molding resin is injected to form a resinous hollow package. As the molding resin, thermosetting resins such as an epoxy resin, a phenol resin, a polyimide resin and an unsaturated polyester resin; and heat resistant thermoplastic resins such as a liquid crystal polymer, a polyphenylene oxide resin, a polyphenylene sulfide resin and a polysulfone resin may be used. Among these, in view of maintaining a balance between endurance, dimensional stability and cost, an epoxy resin that is a thermosetting resin or an epoxy compound obtained by mixing the epoxy resin with other resin(s) is particularly preferred.

To the molding resin, usually, inorganic fillers of silica, alumina, zeolite, boron nitride, aluminum nitride, silicon nitride and the like, or organic fillers of an acrylic acid polymer and the like, are added.

As an injection method of a molding resin, various kinds of injection molding methods may be used. However, a transfer molding method is particularly preferably used in view of precisely controlling the amount of the injected molding resin.

Subsequent steps of forming the resinous hollow package to the injection of the molding resin will be described.

After the injection of the molding resin into the gap portion 23 of the mold 2, as needs arise, post-curing is carried out, and a resinous hollow package formed after curing is taken out of the mold 2. Next, as needs arise, the resinous hollow package is subjected to processes of removing resin burr, cutting the dam bar 12, bending the outer lead 11b into a desired shape, and the like, followed by a step of mounting a semiconductor element.

On a semiconductor element mounting surface of the resinous hollow package, a semiconductor element is fixed with an adhesive or the like. Then, a terminal of the semiconductor element and a corresponding inner lead 11a of the resinous hollow package are wire-bonded with a thin metal wire of gold, aluminum or the like. Thereafter, an opening portion is sealed with an optically transparent sealing material such as glass, thereby completing formation of the resinous hollow package on which a semiconductor element is mounted.

EXAMPLES

In the following, the invention will be detailed with reference to the examples and comparative examples. However, the invention is not restricted to the examples.

Example 1

A 0.25 mm thick lead frame made of 42 alloy with 80 lead pins and a 24 mm×14 mm moisture-proof island, and having the same shape as that of the lead frame illustrated in FIG. 1, was used. The lead frame was inserted into a mold composed of upper and lower molds provided with four projections for fixing the moisture-proof island, respectively, in a similar manner to the mold illustrated in FIG. 3.

Next, a transfer molding process was performed under conditions of 170° C. and 2 MPa for 90 seconds, using the above mold, with an epoxy compound prepared as a molding resin by mixing 84 parts by weight of silica and 2 parts by weight of a releasing agent to 8 parts by weight of an epoxy resin and 4 parts by weight of a phenol resin, and then kneading with heat. A gate through which the molding resin is injected was formed on the lower mold.

Then, the molded article was taken out of the mold and cooled to room temperature. Thereafter, post-curing was carried out at 175° C. for 3 hours and cooled to room temperature, thereby completing the curing process.

An external dimension of the resin portion of the obtained resinous hollow package not including the outer lead was 37 mm in a longer side, 26 mm in a shorter side, and 2 mm in a thickness from a bottom surface of the package to a top surface of a sidewall portion.

A semiconductor element mounting surface of the resinous hollow package was subjected to a surface shape measurement by use of a surface roughness meter, Surfcom 570A (trade name, produced by Tokyo Seiki Co., Ltd.), to evaluate the maximum wave height of a wave curve. The measurement was conducted in a filtered maximum wave mode at conditions of 0.16 mm in the cutoff, 0.6 mm/sec in the scanning speed and 25.0 mm in the scanning distance. The wave curve thus measured is shown in FIG. 5A.

Thereafter, a section obtained by dividing the resinous hollow package into two in a direction parallel with the longer side was observed to confirm a situation of the moisture-proof island in the resinous hollow package. The results thereof are shown in Table 2.

Example 2

A resinous hollow package was molded in a similar manner to Example 1, except that four projections for fixing a moisture-proof island were only disposed on an upper mold and no projection for fixing the moisture-proof island was not disposed to a lower mold, and evaluations were conducted in a similar manner to Example 1. The wave curve thus measured is shown in FIG. 5B and other results are shown in Table 2.

Example 3

A resinous hollow package was molded in a similar manner to Example 1, except that one projection for fixing a moisture-proof island was disposed on each of an upper mold center and a lower mold center, and evaluations were conducted in a similar manner to Example 1. The results are shown in Table 2.

Example 4

A resinous hollow package was molded in a similar manner to Example 1, except that one projection for fixing a moisture-proof island was disposed on an upper mold center and no projection fixing a moisture-proof island was disposed on a lower mold, and evaluations were conducted in a similar manner to Example 1. The results are shown in Table 2.

Comparative Example 1

A resinous hollow package was molded in a similar manner to Example 1, except that no projection for fixing a moisture-proof island was disposed on either an upper mold or a lower mold, and evaluations were conducted in a similar manner to Example 1. The results are shown in Table 2.

Comparative Example 2

A resinous hollow package was molded in a similar manner to Example 1, except that the moisture-proof island was not provided with the lead frame, and evaluations were conducted in a similar manner to Example 1. The results are shown in Table 2.

It is found that, in comparison with Comparative Example 2 with no moisture-proof island, Comparative Example 1 with a moisture-proof island shows better flatness of the semiconductor element mounting surface of the resinous hollow package. Furthermore, from the results of Examples 1 through 4 employing the method of producing a resinous hollow package of the invention, it is found that the flatness of the semiconductor element mounting surface of the resinous hollow package can be significantly improved by providing projection(s) for fixing a moisture-proof island with the mold.

When a wave curve of a semiconductor element mounting surface of a resinous hollow package has a convex shape, the mounted solid-state image sensor tends to be fixed on a slope on one side of a convex undulation of the semiconductor element mounting surface due to poor steadiness. In such a resinous hollow package with a solid-state image sensor fixed obliquely, the amount of light is significantly decreased at pixels in a peripheral portion on a subsiding side of the solid-state image sensor.

In the resinous hollow packages of the invention shown in Examples, values of the maximum wave heights are reduced and the shapes of the wave curves are substantially symmetrical concave shapes. Since the shapes of the waves are symmetrically concave, the mounted solid-state image sensors do not tend to be fixed obliquely to the resinous hollow package. As a result, in a digital single-lens reflex camera employing the resinous hollow package of the invention, probability of decrease in the amount of light in a peripheral portion of an image that occurs asymmetrically can be largely reduced, even when an ultra-wide angle lens is used.

Example 5

Next, the moisture resistance of a resinous hollow package was evaluated.

The resinous hollow package obtained in Example 1 was dried at 170° C. for 6 hours, and a glass plate was attached to a hollow portion with a sealing agent (trade name: World Lock 8723L, produced by Kyoritsu Chemical & Co., ltd.) without mounting a semiconductor element.

To the glass-sealed hollow package, a pressure cocker test (hereinafter, referred to as "PCT") shown below was conducted. A glass-sealed hollow package was placed in a thermo-hygrostat bath (pressure cocker test machine) set at 121° C. and relative humidity of 100%, and that was taken out after 96 hours in an environment of 23° C. and relative humid-

TABLE 2

| | Island | Projection of Mold | Wave Shape | Maximum Wave Height | State of Island |
|---|---|---|---|---|---|
| Example 1 | Provided | Upper Mold 4/ Lower Mold 4 | Concave | 15.3 μm | Positioned as Designed |
| Example 2 | Provided | Upper Mold 4 | Concave | 17.3 μm | Positioned as Designed |
| Example 3 | Provided | Upper Mold 1/ Lower Mold 1 | Waved | 22.7 μm | Slightly Tilted |
| Example 4 | Provided | Upper Mold 1 | Waved | 32.9 μm | Tilted |
| Comparative example 1 | Provided | None | Convexly Waved | 40.1 μm | Largely Tilted |
| Comparative example 2 | Not provided | None | Convex | 43.4 μm | — | ity of 50% and left for 15 min. Thereafter, whether or not fogging due to bedewing occurred on the inner side of the glass of the package was observed. One with no fogging was evaluated as A and one with fogging was evaluated as N, and the results are shown in Table 3.

Example 6

The PCT of a resinous hollow package was carried out in a similar manner to Example 5, except that a lead frame with a moisture-proof island having an area of 100 mm² was used. The results are shown in Table 3.

Comparative Example 3

The PCT of a resinous hollow package was carried out in a similar manner to Example 5, except that a lead frame with no moisture-proof island was used. The results are shown in Table 3.

Comparative Example 4

The PCT of a resinous hollow package was carried out in a similar manner to Example 5, except that a lead frame with a moisture-proof island having an area of 50 mm² was used. The results are shown in Table 3.

TABLE 3

|  | Island | Area of Island | PCT |
|---|---|---|---|
| Example 5 | Provided | 336 mm² | A |
| Example 6 | Provided | 100 mm² | A |
| Comparative Example 3 | Not provided | 0 mm² | N |
| Comparative Example 4 | Provided | 50 mm² | N |

In the method of the invention, holes through which a moisture-proof island is exposed are formed on a back surface of a resinous hollow package and/or on a semiconductor element mounting surface. These holes do not cause particular problems even if they are left untouched. However, they may be utilized as heat dissipation paths for cooling the heat generated by the mounted semiconductor element by filling a thermal conductive material in the holes. In particular, heat generated by the semiconductor element can efficiently be dissipated by providing a heat dissipation plate on the back surface of the resinous hollow package and filling with a thermal conductive material so that the heat dissipation plate and the semiconductor element mounted on the resinous hollow package may be thermally in contact with each other.

INDUSTRIAL APPLICABILITY

By employing the resinous hollow package of the invention, a digital single-lens reflex camera in which reduction in the amount of light in a peripheral portion of an image is suppressed even when an ultra-wide angle lens is used can be produced without damaging the moisture resistance thereof.

EXPLANATION OF REFERENCE NUMERALS

1: Lead Frame
11: Lead Pins
11a: Inner Lead
11b: Outer Lead
12: Dam Bar
13: Moisture-proof Island
2: Mold
21: Upper Mold
22: Lower Mold
23: Gap Portion
24: Projection provided on Upper Mold
25: Projection provided on Lower Mold
31: Semiconductor Element Mounting Surface of Resinous Hollow Package
32: Terrace Portion of Resinous Hollow Package
33: Sidewall Portion of Resinous Hollow Package
4: Measurement Probe of Surface Roughness Meter

The invention claimed is:

1. A resinous hollow package for mounting a semiconductor element, comprising a lead frame including a moisture-proof island connected to the lead frame, a semiconductor element mounting surface, wherein an area of the mounting surface is 200 mm² or more and a maximum wave height of a wave curve of the mounting surface is 35 μm or less.

2. The resinous hollow package of claim 1, wherein the area of the moisture-proof island is 100 mm² or more.

3. A semiconductor device comprising the resinous hollow package of claim 1 on which the semiconductor element is mounted.

4. A semiconductor device comprising the resinous hollow package of claim 2 on which the semiconductor element is mounted.

5. A method of producing a resinous hollow package for mounting a semiconductor element, comprising a lead frame including a moisture-proof island connected to the lead frame, a semiconductor element mounting surface, wherein an area of the mounting surface is 200 mm² or more and a maximum wave height of a wave curve of the mounting surface is 35 μm or less, said method comprising injecting a molding resin into a mold in which the moisture-proof island is fixed to the mold by at least one projection provided to the mold.

6. The method of producing the resinous hollow package of claim 5, wherein the at least one projection that fixes the moisture-proof island is provided to each of an upper mold and a lower mold that constitute the mold.

7. The method of producing the resinous hollow package of claim 5, wherein the at least one projection that fixes the moisture-proof island is provided to either of the upper mold or the lower mold that does not have a gate for injecting the molding resin.

8. A method of producing a resinous hollow package for mounting a semiconductor element, comprising a lead frame including a moisture-proof island having an area of 100 mm² or more and connected to the lead frame, a semiconductor element mounting surface, wherein an area of the mounting surface is 200 mm² or more and a maximum wave height of a wave curve of the mounting surface is 35 μm or less, said method comprising injecting a molding resin into a mold in which the moisture-proof island is fixed to the mold by at least one projection provided to the mold.

9. The method of producing the resinous hollow package of claim 8, wherein the at least one projection that fixes the moisture-proof island is provided to each of an upper mold and a lower mold that constitute the mold.

10. The method of producing the resinous hollow package of claim 8, wherein the at least one projection that fixes the moisture-proof island is provided to either of the upper mold or the lower mold that does not have a gate for injecting the molding resin.

* * * * *